(12) United States Patent
Kang

(10) Patent No.: US 6,826,097 B2
(45) Date of Patent: Nov. 30, 2004

(54) NONVOLATILE MEMORY DEVICE INCLUDING WRITE PROTECTED REGION

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/608,473

(22) Filed: Jun. 30, 2003

(65) Prior Publication Data

US 2004/0120187 A1 Jun. 24, 2004

(30) Foreign Application Priority Data

Dec. 24, 2002 (KR) .................. 10-2002-0083351

(51) Int. Cl.$^7$ ................................................ G11C 7/00
(52) U.S. Cl. ............... 365/196; 365/185.04; 365/195; 365/189.07
(58) Field of Search ....................... 365/196, 195, 365/185.04, 189.07

(56) References Cited

U.S. PATENT DOCUMENTS

| | | | | |
|---|---|---|---|---|
| 5,991,197 A | * | 11/1999 | Ogura et al. | 365/185.11 |
| 6,034,889 A | * | 3/2000 | Mani et al. | 365/185.04 |
| 6,073,243 A | * | 6/2000 | Dalvi et al. | 713/202 |
| 6,446,179 B2 | * | 9/2002 | Baltar | 711/163 |
| 6,510,501 B1 | | 1/2003 | Ho | |
| 6,535,420 B1 | | 3/2003 | Kawamata | |
| 6,542,426 B2 | | 4/2003 | Jung et al. | |
| 6,542,919 B1 | | 4/2003 | Wendorf et al. | |
| 6,556,476 B1 | * | 4/2003 | Na | 365/185.04 |
| 6,650,571 B2 | * | 11/2003 | Keays | 365/185.33 |
| 6,671,785 B2 | * | 12/2003 | Dalvi et al. | 711/154 |
| 6,711,701 B1 | * | 3/2004 | Roohparvar et al. | 714/24 |
| 6,772,307 B1 | * | 8/2004 | Nguyen et al. | 711/163 |

* cited by examiner

Primary Examiner—Richard Elms
Assistant Examiner—Tuan T. Nguyen
(74) Attorney, Agent, or Firm—Heller Ehrman White and McAuliffe LLP

(57) ABSTRACT

A nonvolatile memory device including a write protected region, comprising a program command processor, a write protected region setting unit and a write controller. The program command processor outputs a program command signal by decoding an external signal. The write protected region setting unit stores a region address corresponding to an inputted address when the program command signal is activated, and outputs a write protect signal when the program command signal is inactivated. The write controller controls a cell corresponding to the region address not to perform a write mode when the write protect signal is activated.

15 Claims, 17 Drawing Sheets

NONVOLATILE MEMORY DEVICE INCLUDING WRITE PROTECTED REGION

BACKGROUND OF THE INVENTION

1. Field of the Invention

The present invention generally relates to nonvolatile memory device, and more specifically, to a nonvolatile memory device including a write protected region.

2. Description of the Prior Art

In nonvolatile memory devices such as flash memory or ferroelectric memory devices, recorded information can be maintained even when a power source is turned off. However, in the conventional nonvolatile memory device having no data protecting means, an undesired operation may destroy data.

SUMMARY OF THE INVENTION

It is therefore an object of the present invention to provide a nonvolatile memory device which can set up a write protect function on the memory cells.

There is provided a nonvolatile memory device having a write protected region therein, comprising a program command processor, a write protected region setting unit and a write controller. The program command processor outputs a program command signal by decoding an external signal. The write protected region setting unit stores a region address corresponding to an inputted address when the program command signal is activated, and outputs a write protect signal when the program command signal is inactivated. The write controller controls a write operation not to be performed on a cell corresponding to the region address when the write protect signal is activated.

DETAILED DESCRIPTION OF THE PREFERRED EMBODIEMTNS

The present invention will be described in more detail with reference to the accompanying drawings.

Figure 1:
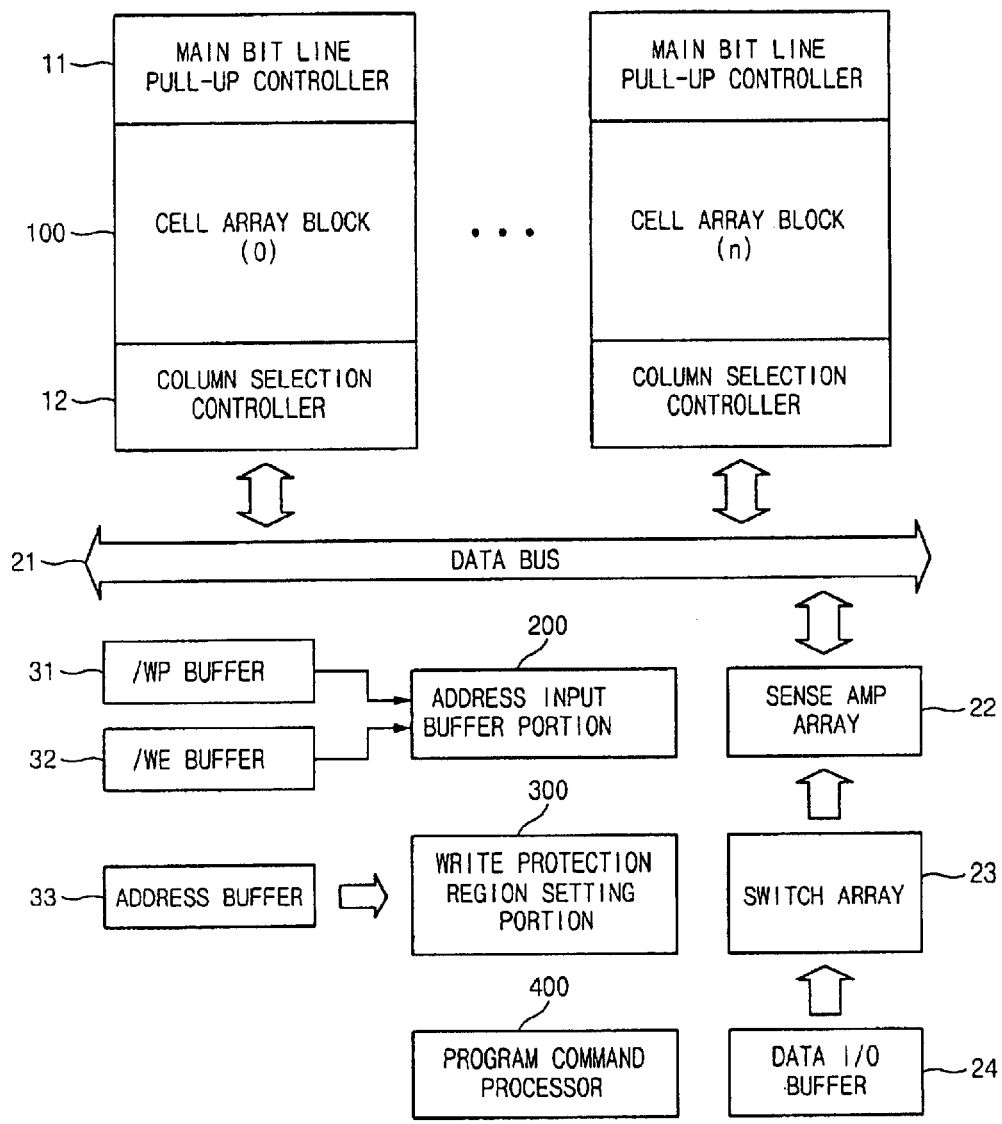
FIG. 1 is a block diagram showing a ferroelectric memory device including a write protected region according to an example of the present invention.

FIG. 1 is a block diagram showing a ferroelectric memory device including a write protected region according to an example of the present invention.

The nonvolatile memory device of the present invention comprises a cell array block 100, a main bitline pull-up controller 11, a column selection controller 12, a sense amplifier array 22, a switch controller 23 and an I/O buffer 24. The main bitline pull-up controller 11 pulls up a main bitline included in the cell array block 100 to a positive voltage. The column selection controller 12 connects the main bitline to a data bus unit 21. The sense amplifier array 22 is connected to the data bus unit 21. The switch controller 23 controls the sense amplifier array 22. The I/O buffer 24 exchanges data with the sense amplifier array 22.

The nonvolatile memory device of the present invention also comprises a write controller 200, a write protected region setting unit 300, and a program command processor 400 for performing a write protected operation.

The program command processor 400 decodes a write protection command. The write protected region setting unit 300 is controlled by an address inputted from an address buffer 33 and an output signal from the program command processor 400 to set up a write protected region. The write controller 200 controls read or write operations in response to a write protect signal provided from a /WP buffer 31, a write enable signal provided from a /WE buffer 32, and an output signal from the write protection region setting unit 300.

Figure 2:
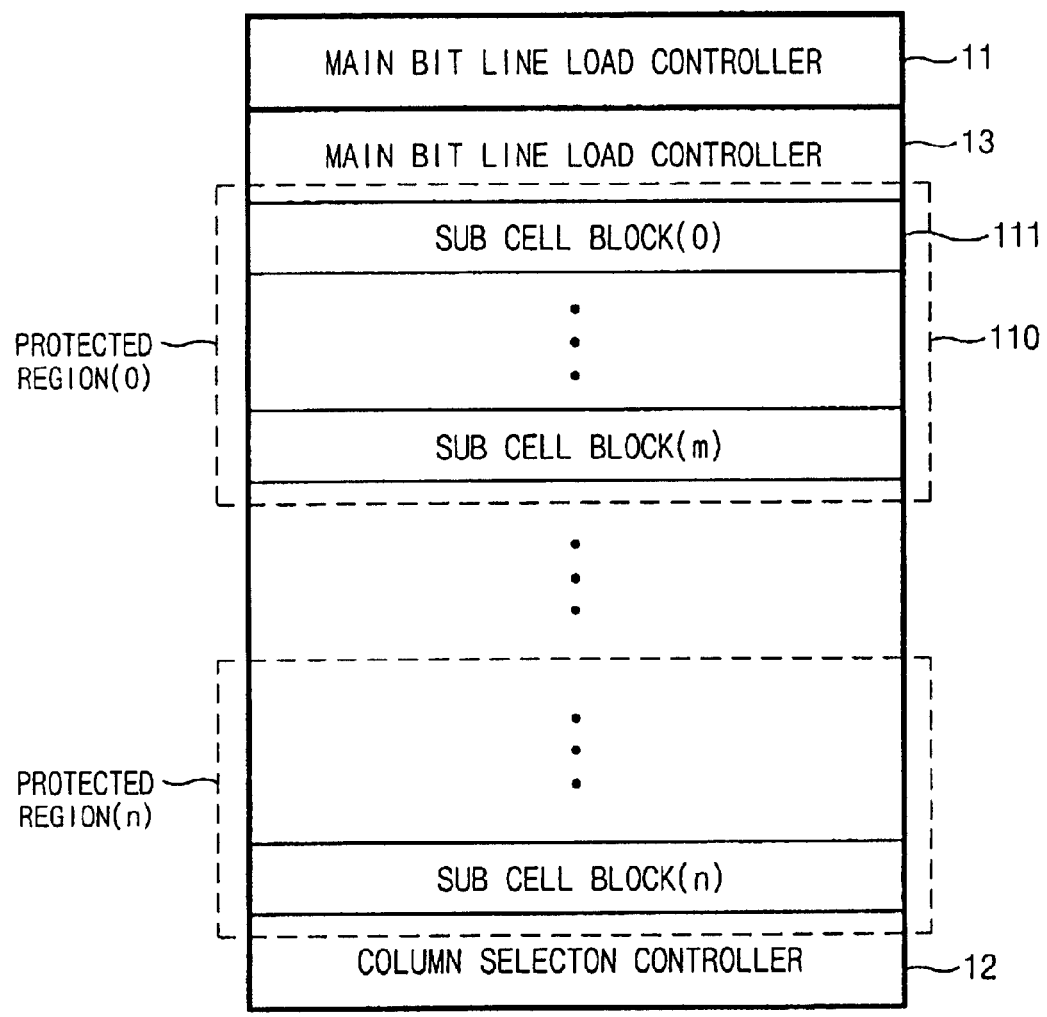
FIG. 2 is a structural diagram showing a main bitline pull-up controller, a cell array block and a column selection controller of FIG. 1.

FIG. 2 is a structural diagram showing a main bitline pull-up controller 11, a cell array block 100 and a column selection controller 12 of FIG. 1. The cell array block 100 includes a plurality of main bitline load controllers 13 and a plurality of sub cell blocks 111. When two or more main bitline load controllers 13 are connected to one main bitline, the same number of sub cell blocks 110 are assigned to a main bitline load controller 13 and the main bitline load controllers 13 are evenly placed apart from each other. All or some of the cell array blocks can be designated as protected regions (100). A plurality of sub cell blocks ill may be included in a protected region 110. The sub cell blocks 111 included in the same protected region 110 operate in the same mode.

Figure 3:
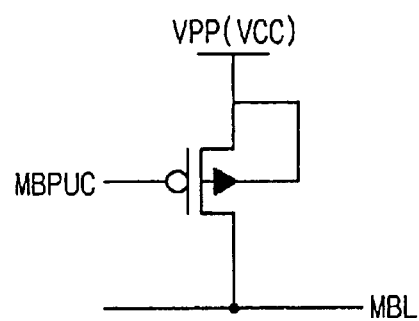
FIG. 3 is a structural diagram showing the main bitline pull-up controller of FIG. 1.

FIG. 3 is a structural diagram showing the main bitline pull-up controller 11 of FIG. 1. The main bitline pull-up controller 11 comprises a PMOS transistor having a gate to receive a control signal MBPUC, a source connected to a power source VPP(VCC), and a drain connected to a main bitline MBL.

The main bitline pull-up controller 11 pulls up the main bitline MBL to a voltage VPP(VCC) in a precharge operation.

Figure 4:
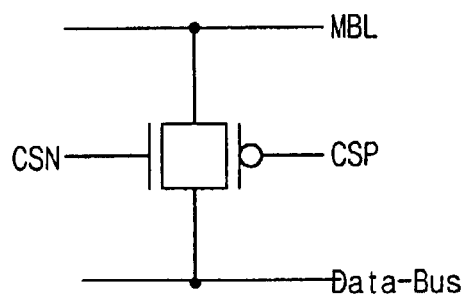
FIG. 4 is a structural diagram showing a main bitline load controller of FIG. 2.

FIG. 4 is a structural diagram showing the main bitline load controller 13 of FIG. 2. The main bitline load controller 13 comprises a PMOS transistor having a gate to receive a control signal MBLC, a source connected to the power source VPP(VCC), and a drain connected to the main bitline MBL.

The main bitline load controller 13 as a resistive device connected between the power source VPP(VCC) and the main bitline MBL determines a potential of the main bitline according to the amount of current flowing through the main bitline load controller 13 in a data sensing operation.

The main bitline MBL is connected to one or more main bitline load controllers 13. When two or more main bitline load controllers 13 are connected to the main bitline MBL, the main bitline load controllers 13 are evenly placed apart from each other.

Figure 5:
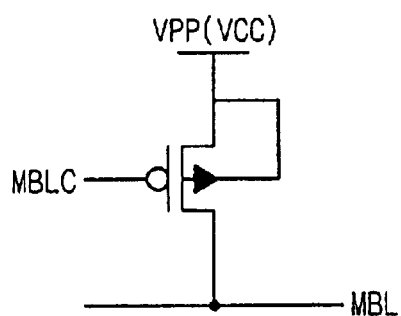
FIG. 5 is a structural diagram showing the column selection controller of FIG. 1.

FIG. 5 is a structural diagram showing the column selection controller 12 of FIG. 1. The column selection controller 12 is a switch for connecting the main bitline MBL and the data bus. Its on/off operations are controlled by control signals CSN and CSP.

Figure 6:
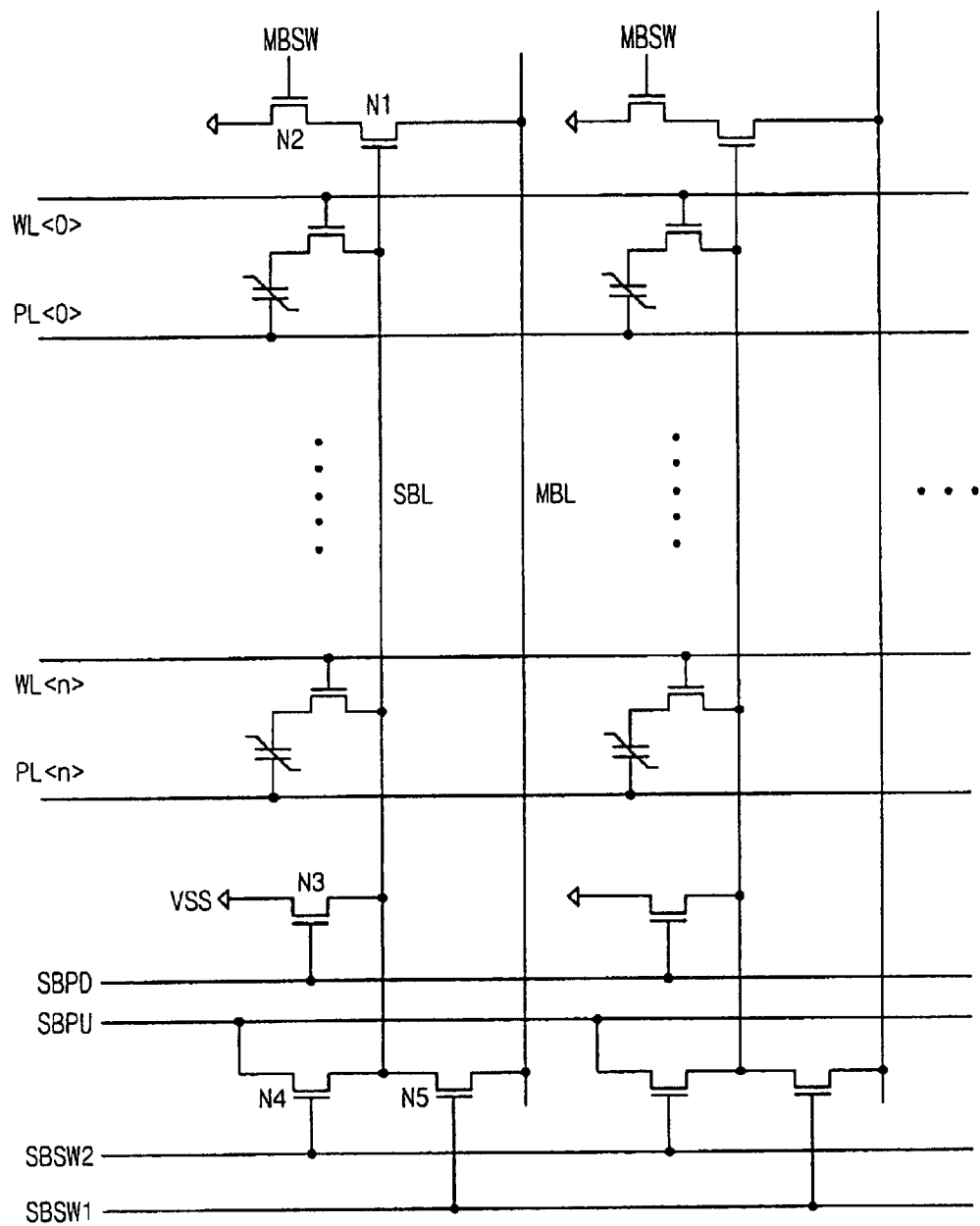
FIG. 6 is a structural diagram showing a sub cell block of FIG. 2.

FIG. 6 is a structural diagram showing the sub cell block 111 of FIG. 2. The sub cell block 110 comprises a sub bitline SBL, and NMOS transistors N1, N2, N3, N4 and N5. The sub bitline SBL are connected in common to a plurality of unit cells, each of which is connected to a wordline WL<m> and a plateline PL<m>. The NMOS transistor N1 for regulating a current has a gate connected to a first terminal of the sub bitline SBL, and a drain connected to the main bitline MBL. The NMOS transistor N2 has a gate connected to a control signal MBSW, a drain connected to a source of the NMOS transistor N1 and a source connected to ground. The NMOS transistor N3 has a gate connected to a control signal SBPD, a drain connected to a second terminal of the sub bitline SBL and a source connected to ground. The NMOS transistor N4 has a gate connected to a control signal SBSW2, a source connected to the second terminal of the sub bitline SBL and a drain connected to a control signal SBPU. The NMOS transistor N5 has a gate connected to a control signal SBSW1, a drain connected to the main bitline MBL and a source connected to the second terminal of the sub bitline SBL.

When a unit cell is to be accessed, only the sub bitline connecting the unit cell is connected to the main bitline. Here, the sub bitline SBL is connected to the main bitline MBL via the NMOS transistor N5. Accordingly, memory read/write operations can be performed even with a smaller amount of load corresponding to one sub bitline rather than a larger amount of load corresponding to the whole bitline.

The sub bitline SBL is grounded when the control signal SBPD is activated. The control signal SBPU regulates a voltage to be provided to the sub bitline SBL. The control signal SBSW1 regulates the flow of a signal between the sub bitline SBL and the main bitline MBL. The control signal SBSW2 regulates the flow of a signal between the control signal SBPU and the sub bitline SBL.

The sub bitline SBL connected to a gate of the NMOS transistor N1 regulates a sensing voltage of the main bitline. The main bitline MBL is connected to the power source VPP(VCC) via the main bitline load controller 13. When a control signal MBSW becomes at a high level, current flows from the power source VPP(VCC), through the main bitline load controller 13, the main bitline MBL and the NMOS transistors N1 and N2, to ground. Here, the amount of the current is determined by a voltage of the sub bitline SBL connected to the gate of the NMOS transistor N1. If data of a cell is "1", the amount of the current becomes larger, thereby decreasing the voltage of the main bitline MBL. If data of a cell is "0", the amount of the current becomes smaller, thereby increasing the voltage of the main bitline MBL. Here, the cell data can be detected by comparing the voltage of the main bitline MBL with a reference voltage. Detecting the cell data is performed in the sense amplifier array 22.

Figure 7:
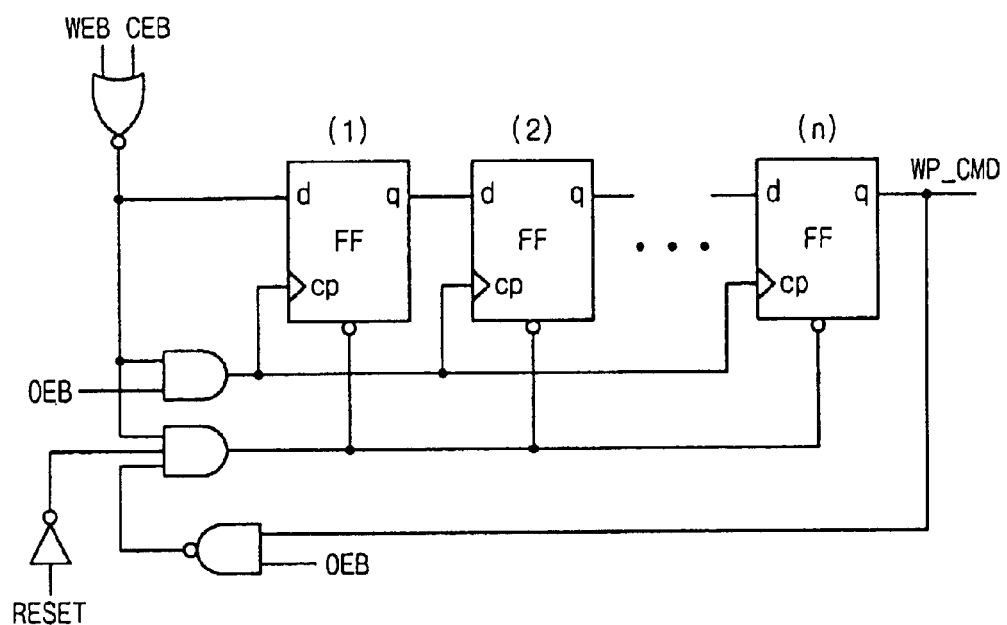
FIG. 7 is a structural diagram showing a program command processor according to the present invention.
Figure 8:
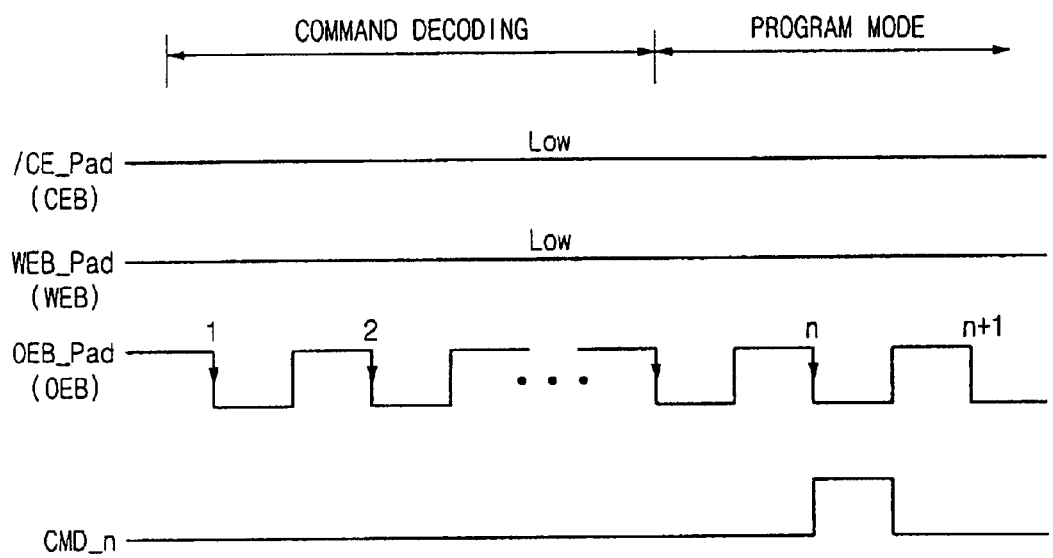
FIG. 8 is a diagram showing the operation of the program command processor of FIG. 7.

FIG. 7 is a structural diagram showing a program command processor included in the memory device according to the present invention. FIG. 8 is a timing diagram showing the operation of the program command processor according to the present invention. Referring to FIG. 8, the program command processor of FIG. 7 is explained. All D flip-flops of FIG. 7 are supposed to be synchronized at a falling edge of a clock signal.

If a write enable signal WEB and a chip enable signal CEB are activated to a low level, a clock signal generated by toggling an output enable signal OEB is provided to a clock input terminal. Since there are N D flip-flops connected serially, if the output enable signal OEB toggles N-times, a high level output from a NOR gate is propagated to an output signal WP_CMD of the $N^{th}$ flip-flop. However, when the output signal WP_CMD is activated, if the output enable signal OEB becomes at the high level, all D flip-flops are reset. As a result, the output signal WP_CMD becomes at the low level. The output signal WP_CMD is activated at a $N^{th}$ falling edge of the output enable signal OEB, and inactivated at the $(N+1)^{th}$ rising edge of the output enable signal OEB.

Figure 9:
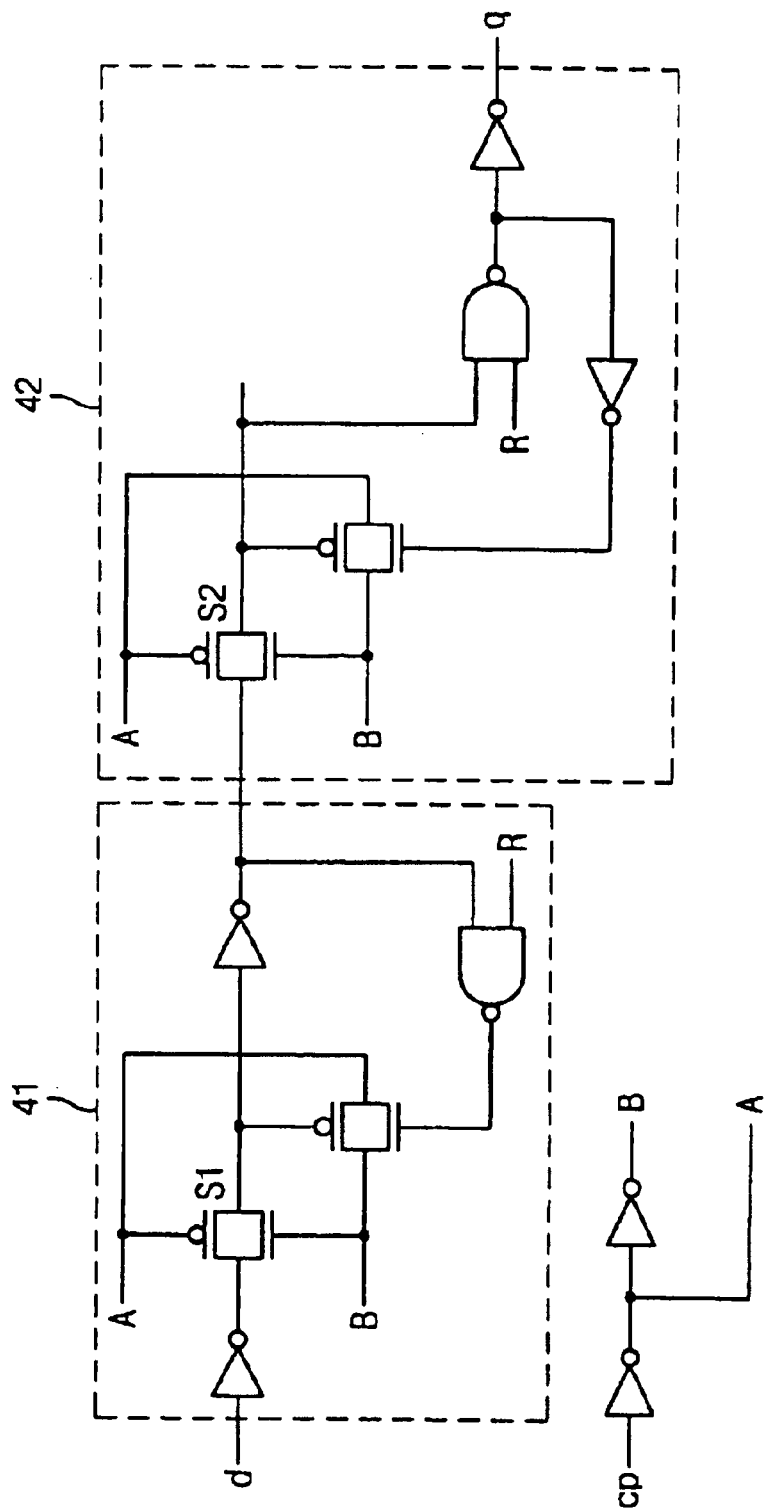
FIG. 9 is a structural diagram showing a D flip-flop used in FIG. 8.

FIG. 9 is a structural diagram showing the D flip-flop used in FIG. 7. In general, a D flip-flop is a circuit for sampling and outputting a signal provided to an input terminal at a rising or falling edge of a clock. The circuit of FIG. 9 samples an input signal d at a falling edge of the clock CP. When the clock CP becomes "high", a master unit 41 turns on the gate S1, and stores the input signal d in a latch. Here, since the gate S2 of a slave unit 42 is turned off, the input signal d is not transmitted into a latch of the slave unit 42. If the clock CP becomes "low", the gate S1 of the master unit 41 is closed, and the gate S2 of the slave unit 42 is opened. As a result, data stored in the latch of the master unit 41 is stored in the latch of the slave unit 42, and the signal stored in the latch of the slave unit 42 is continuously outputted until the next falling edge of the clock CP.

Figure 10:
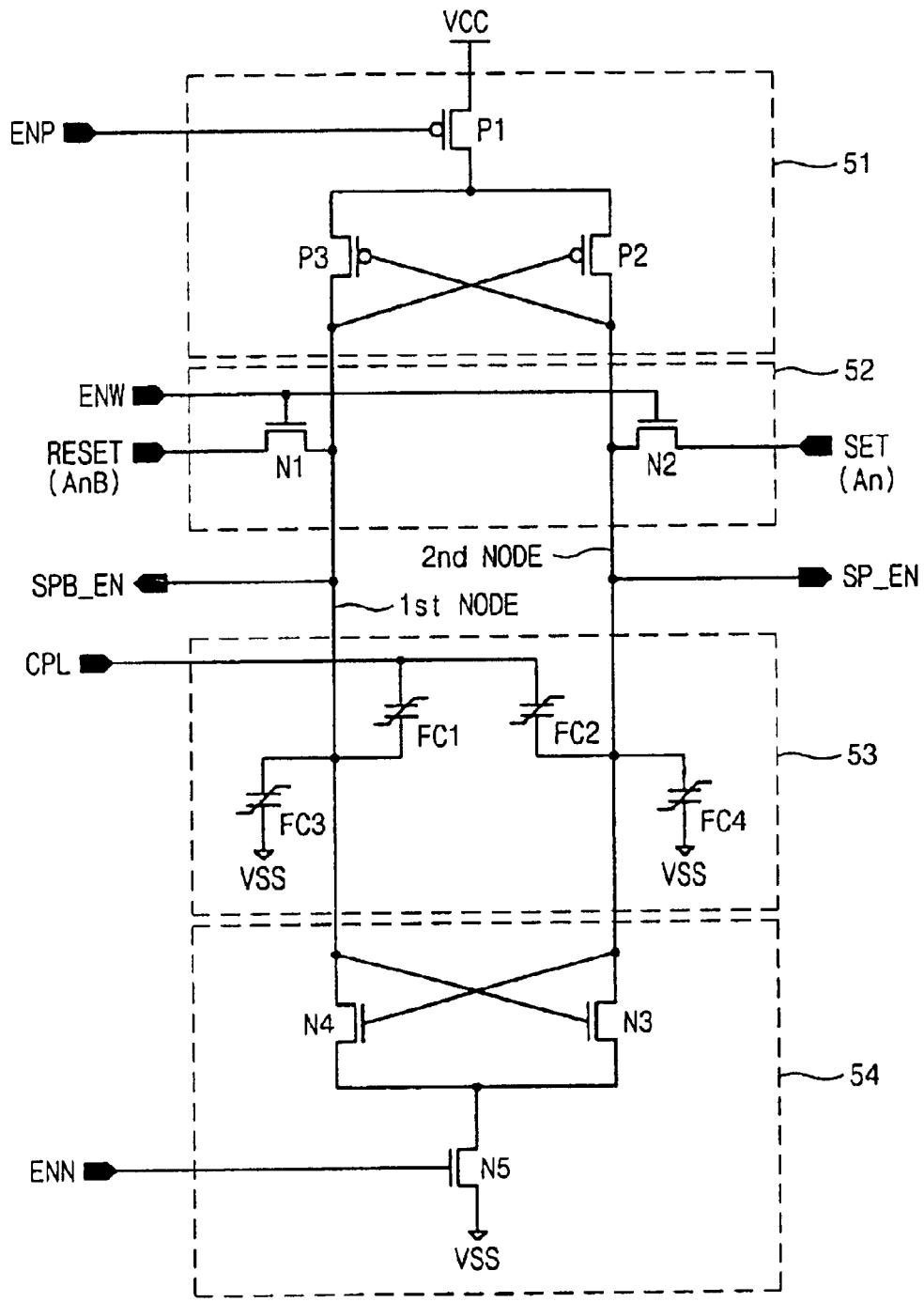
FIG. 10 is a structural diagram showing a register included in the memory device according to the present invention.

FIG. 10 is a structural diagram showing a register included in the memory device according to the present invention. The register comprises a first amplifier 51, an input unit 52, a storage unit 53 and a second amplifier 54.

The first amplifier 51 comprises PMOS transistors P1, P2 and P3. The PMOS transistor P1 has a gate to receive a first control signal ENP, and a source connected to a positive power source. The PMOS transistor P2 has a gate connected to a first node, a source connected to a drain of the PMOS transistor P1, and a drain connected to a second node. The PMOS transistor P3 has a gate connected to the second node, a source connected to the drain of the PMOS transistor P1, and a drain connected to the first node.

The second amplifier 54 comprises NMOS transistors N3, N4 and N5. The NMOS transistor N3 has a gate connected to a first node, and a drain connected to a second node. The NMOS transistor N4 has a gate connected to the second node, and a drain connected to the first node. The NMOS transistor N5 has a gate to receive a second control signal ENN, a drain connected to a source of the NMOS transistor N3 and a source of the NMOS transistor N4, and a source connected to ground.

The input unit 52 comprises NMOS transistors N1 and N2. The NMOS transistor N1 has a gate to receive a third control signal ENW, a source to receive a data signal RESET(AnB), and a drain connected to the first node. The NMOS transistor N2 has a gate to receive the third control signal ENW, a source to receive a data signal SET(An), and a drain connected to the second node.

The storage unit 53 comprises ferroelectric capacitors FC1, FC2, FC3 and FC4. The ferroelectric capacitor FC1 is connected between a fourth control signal CPL and the first node. The ferroelectric capacitor FC2 is connected between a fourth control signal CPL and the second node. The ferroelectric capacitor FC3 is connected between the first node and ground. The ferroelectric capacitor FC4 is connected between the second node and ground.

When the control signal ENP is "low" and the control signal ENN is "high", the first amplifier 51 and the second amplifier 54 fix a node having a higher voltage between the first node and the second node at VCC and a node having a lower voltage at VSS. When the control signal ENP is "high" and the control signal ENN is "low", the register is intercepted from the power source.

When the control signal ENW is "high", the input unit 52 provides data signals SET and RESET, respectively, to the second node and the first node. When the control signal ENW is "low", the first node and the second node are intercepted from the data signals SET and RESET.

The storage unit 53 stores data signals provided to the first node and the second node in the ferroelectric capacitors FC1, FC2, FC3 and FC4 by regulating the control signal CPL.

An output signal SPB_EN is outputted from the first node, and an output signal SP_EN is outputted from the second node.

Figure 11:
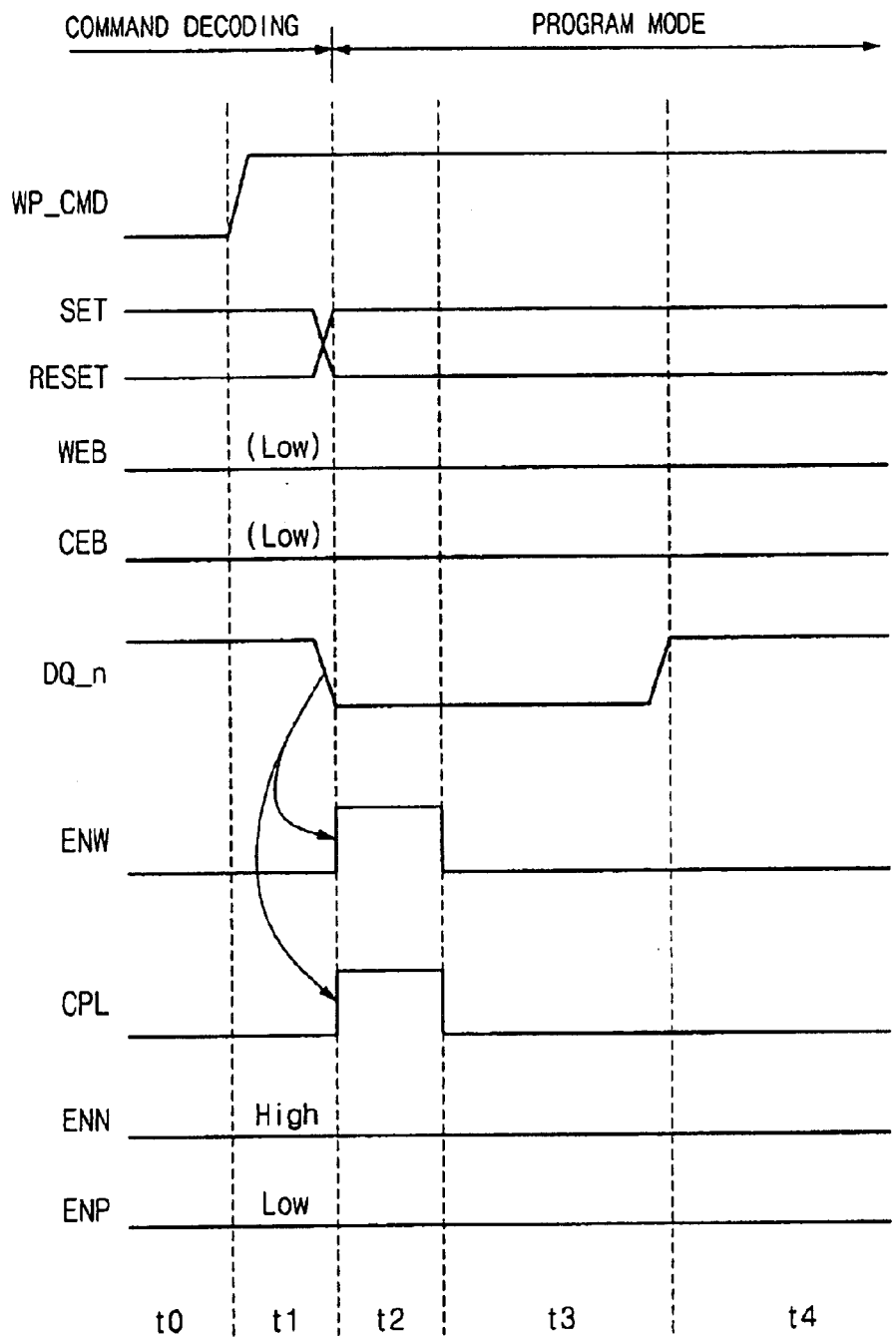
FIG. 11 is a timing diagram showing a write mode of the register of FIG. 10.

FIG. 11 is a timing diagram showing a write mode of the register of FIG. 10. If the program command signal WP_CMD is activated, the program command processor 400 of FIG. 4 is inactivated until the write process of the register is finished.

Referring to FIG. 11, the program command signal WP_CMD is activated in a cycle t1, and a data signal DQ_n provided from the data I/O pad is transited from the high level to the low level. As a result, the control signal ENW is activated, and the data signals SET and RESET are provided, respectively, to the second node and the first node. If the signal CPL becomes at the high level, signals are stored in the ferroelectric capacitors FC1 through FC4 depending on the voltages of the first node and the second node. For example, when the first node is "low", and the second node is "high", charges are stored in the ferroelectric capacitors FC1 and FC4.

In a cycle t3, if the control signal ENW is "low", the data signals SET and RESET are separated from the first node and the second node. The voltages of the first node and the second node are amplified and maintained by the first amplifier 51 and the second amplifier 54. If the control signal CPL becomes "low", charges are re-distributed between the ferroelectric capacitors FC1 and FC3, and between the ferroelectric capacitors FC2 and FC4. Here, the voltages of the first node and the second node vary with the re-distribution of the charges. The voltage of the second node becomes higher than that of the first node. The ferroelectric capacitors FC1 through FC4 maintain the stored charges even when the power source is turned off. In a cycle t4, if the signals DQ_n becomes "high", the program mode is finished. The signal DQ_n is used to generate a pulse signal (refer to FIG. 13).

Figure 12:
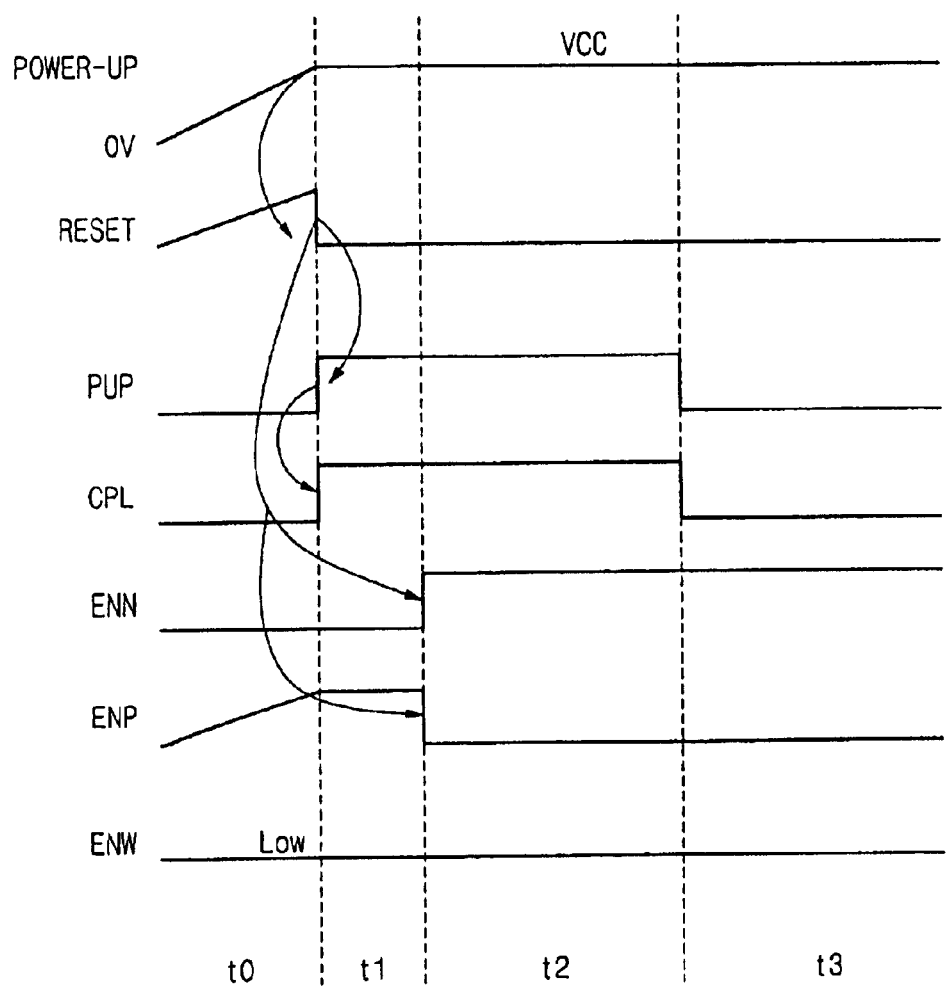
FIG. 12 is a timing diagram showing a read mode of the register of FIG. 10.

FIG. 12 is a timing diagram showing a read mode of the register of FIG. 10.

In the cycle t1, if the power source reaches a stable level, a power-up detection signal PUP becomes activated. If the control signal CPL is transited to a "high" level using the signal PUP, voltage difference between the first node and the second node is generated by the charges stored in the ferroelectric capacitors FC1 to FC4 of FIG. 10.

In a cycle t2, if the sufficient voltage difference is generated, the control signals ENN and ENP are activated, respectively, to a "high" level and to a "low" level. As a result, the data of the first node and the second node are amplified.

After the amplification of the data is completed, the control signal CPL is transited to a "low" level in the cycle t3. As a result, the destroyed data are restored in the ferroelectric capacitors FC1 to FC4. Here, the control signal ENW is inactivated to a "low" level, and the data signals SET and RESET are not provided to the second node and the first node.

Figure 13:
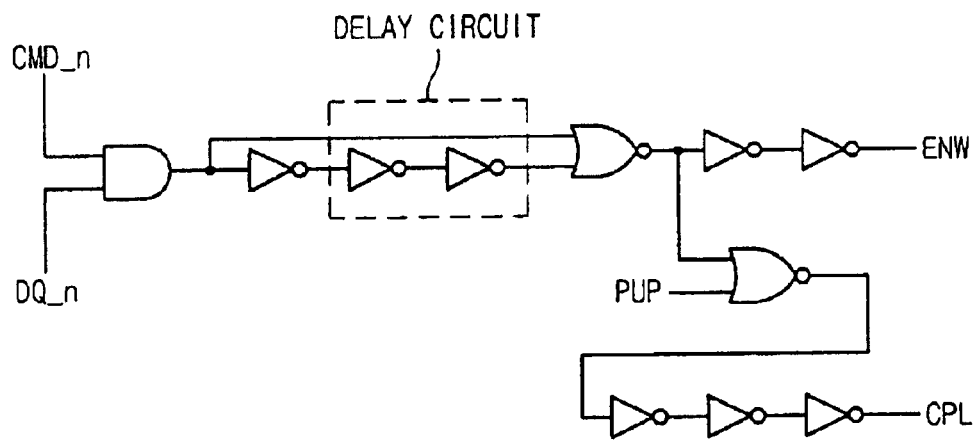
FIG. 13 is a circuit diagram showing a circuit for generating register control signals ENW and CPL of FIG. 10.

FIG. 13 is a circuit diagram showing a circuit for generating register control signals ENW and CPL of FIG. 10. The control signal PUP is to restore data stored in the register after the initial reset. After the program command signal WP_CMD is activated, if the signal DQ_n is transited from a "high" level to a "low" level, the control signals ENW and CPL having a pulse whose width corresponds to the delay time of the delay circuit are generated (see FIG. 11).

Figure 14:
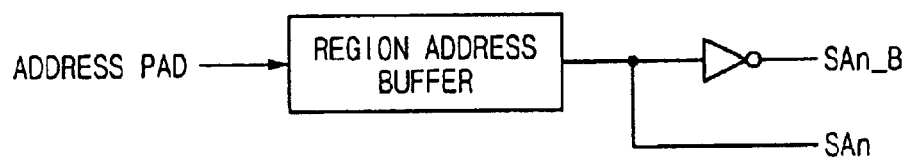
FIG. 14 is a block diagram showing a region address buffer unit included in the memory device according to the present invention.

FIG. 14 is a block diagram showing a region address buffer unit included in the memory device according to the present invention. If a memory address is inputted, the region address buffer outputs region addresses SAn and SAn_B.

Figure 15:
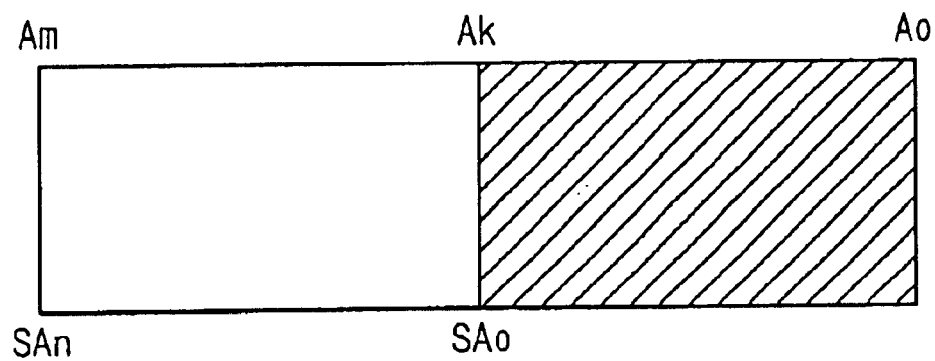
FIG. 15 is a diagram showing a relation between an address of a write protected region and an address inputted to the memory device.

FIG. 15 is a diagram showing the relation between a memory address A and a region address SA. In a preferred embodiment of the present invention, one region address is assigned to every $2^k$ memory addresses. The relation between the memory address and the region address may be freely varied according to preferred embodiments.

Figure 16A:
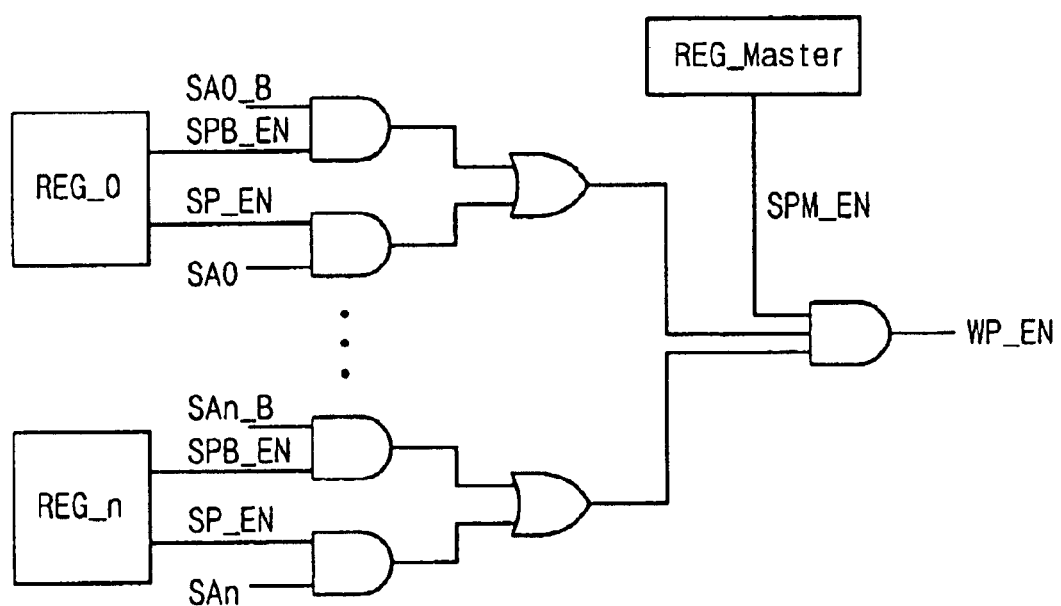
FIGS. 16a and 16b are structural diagrams showing a write protected region setting unit of FIG. 1.

FIG. 16a shows a structure of the write protected region setting unit 300 of FIG. 1. The write protected region setting unit 300 includes a master register REG_Master, and a plurality of registers REG_0~REGn. The output signals SP_EN and SPB_EN of the register REG_0 are AND-operated with the region addresses SA0 and SA0_B respectively. Two signals obtained from the AND operation are OR-operated. The rest registers REG_1~REG_n are configured to have the same operation processes. As a result, (n+1) OR operation results are obtained. A write protect signal WP_EN is obtained by ANDing the (n+1) OR operation results with an output signal SPM_EN from the master register REG_Master.

The write protected region setting unit 300 activates a protection function only when the output signal SPM_EN of the master register REG_Master becomes "high". If the signal SPM_EN becomes "low", the protection function is not activated. In this example, an address of a region to be protected is programmed using a plurality of registers REG_0, . . . , REG_n corresponding to a region address formed of (n+1) bits. If a predetermined region address SA is inputted, each bit $SA_0, \ldots, SA_n$ ($SA_n\_B$: a signal having an opposite level to $SA_n$) is compared with the output signals SP_EN (SPB_EN: a signal having an opposite level to SP_EN) from registers REG_0, . . . , REG_n corresponding to each bit.

For example, an address of a region to be protected is "101", the output signal SP_EN of the register REG_2 is set to be "high", the output signal SP_EN of the register REG_1 to be "low", and the output signal SP_EN of the register REG_0 to be "high". As a result, when the region address "101" is inputted, output signals of all OR gates become "high". Here, if the output signal SPM_EN of the master register REG_Master is "high", the write protect signal WP_EN is activated to a "high" level. Since the registers REG_0~REG_n can be freely programmed, a protection function may be freely set for all protected regions.

Figure 16B:
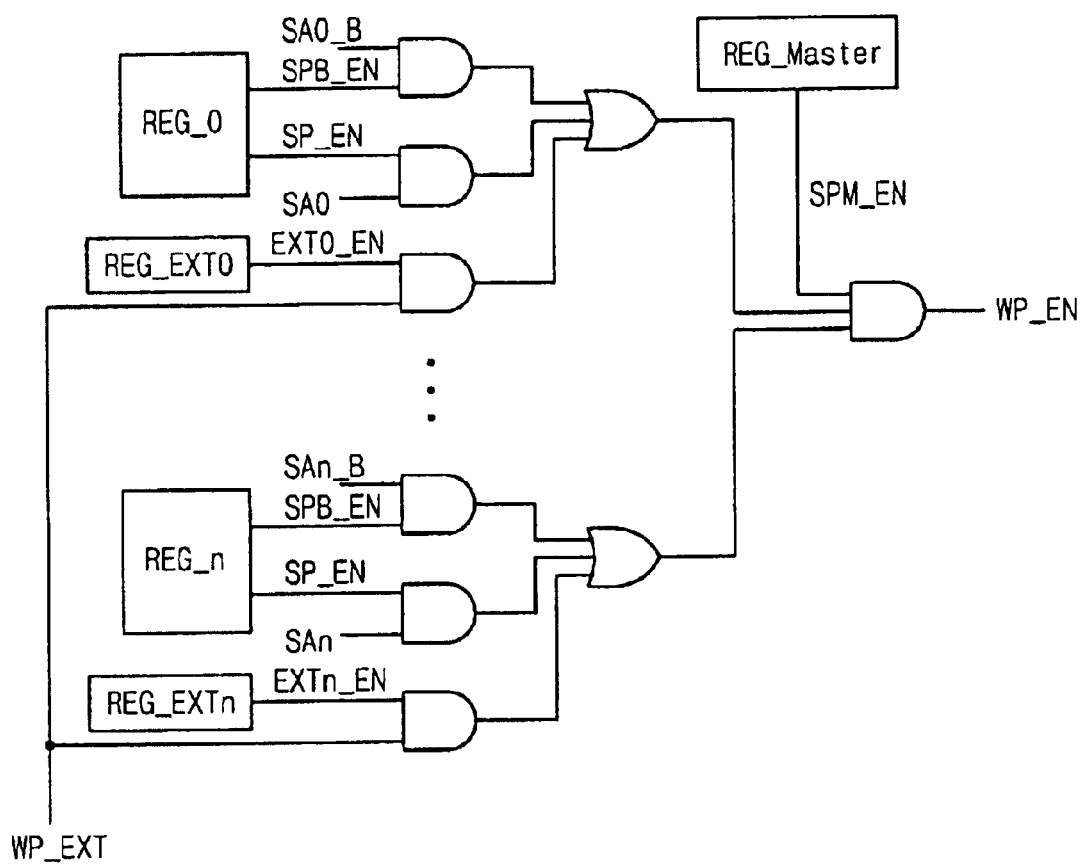

FIG. 16b shows another example of the write protected region setting unit 300 of FIG. 1. In this example, registers REG_EXT0~REG_EXTn are added to the example of FIG. 16a. A signal outputted from the register REG_EXT0 is AND-operated with an external control signal WP_EXT. The AND operation result is OR-operated with two signals obtained by ANDing the output signals SP_EN and SPB_EN of the register REG_0 with the region address signals SA0 and SA0_B. The example of FIG. 16b has the same structure with that of FIG. 16a.

In the example of FIG. 16b, the same operation is performed as described in FIG. 16a. However, the added registers REG_EXT0~REG_EXTn perform the following operations. If a value of the register REG_EXT$_n$ is set as "1", while the external control signal WP_EXT is "high", only the rest region address bits SA$_{n-1}$, . . . , SA$_0$ are compared to determine activation of the signal WP_EN regardless of the value of SA$_n$ as "1" or "0".

For example, a region address stored in the registers REG_3~REG_0 is supposed to be "1111". When the rest address bits are compared except a second bit, "0010" is stored in the register REG_EXT3~REG_EXT0, and the external control signal WP_EXT is set "high". As a result, the signal WP_EN can be activated to a "high" level when the inputted region address SA is "11x1". When the rest address bits are compared except second and third bits, "0110" is stored in the register REG_EXT3~REG_EXT0, and the external control signal WP_EXT is set "high". As a result, when the inputted region address SA is "1xx1", the signal WP_EN is activated to a "high" level.

Figure 17A:
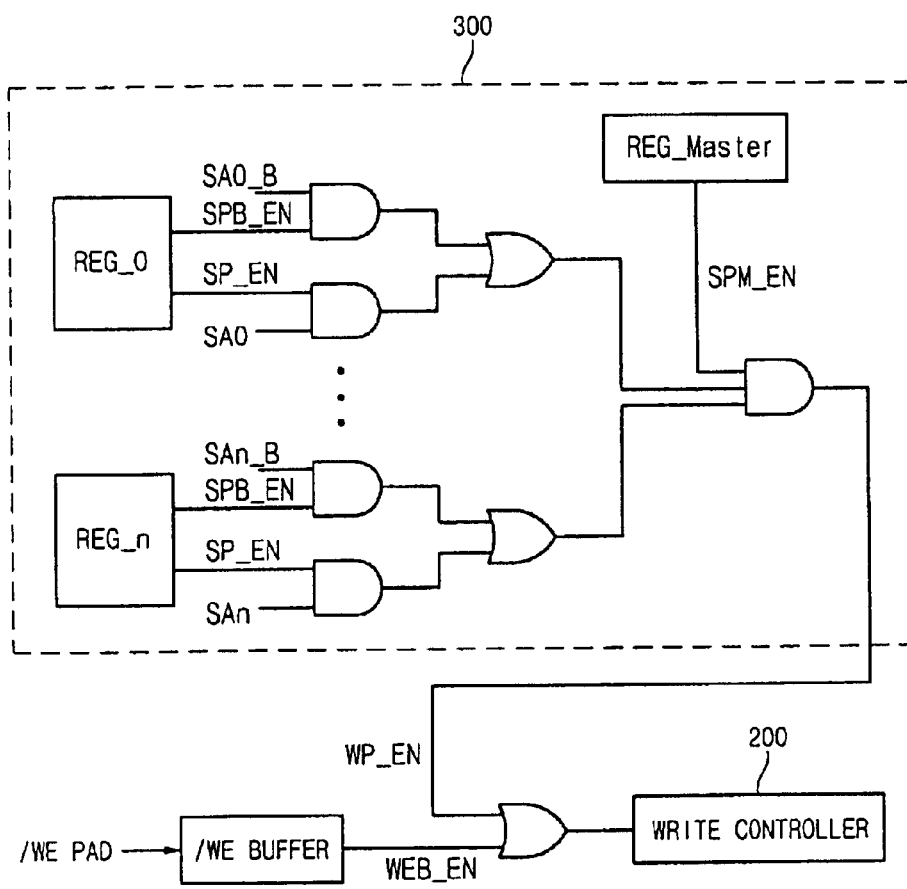
FIGS. 17a through 17c are structural diagrams showing a write controller of FIG. 1.

FIG. 17a is a structural diagram showing the write controller 200 of FIG. 1. The output signal WP_EN of the write protected region setting unit 300 of FIG. 16a is OR-operated with an output signal WEB_EN of the write enable buffer (/WE buffer). The write controller 200 is controlled by the result of OR operation. When the output signal WP_EN of the write protected region setting unit 300 is "high", the write controller 200 starts a read mode regardless of the write enable signal WEB_EN. When the signal WP_EN is "low", the write controller 200 starts a write mode by the write enable signal WEB_EN.

Figure 17B:
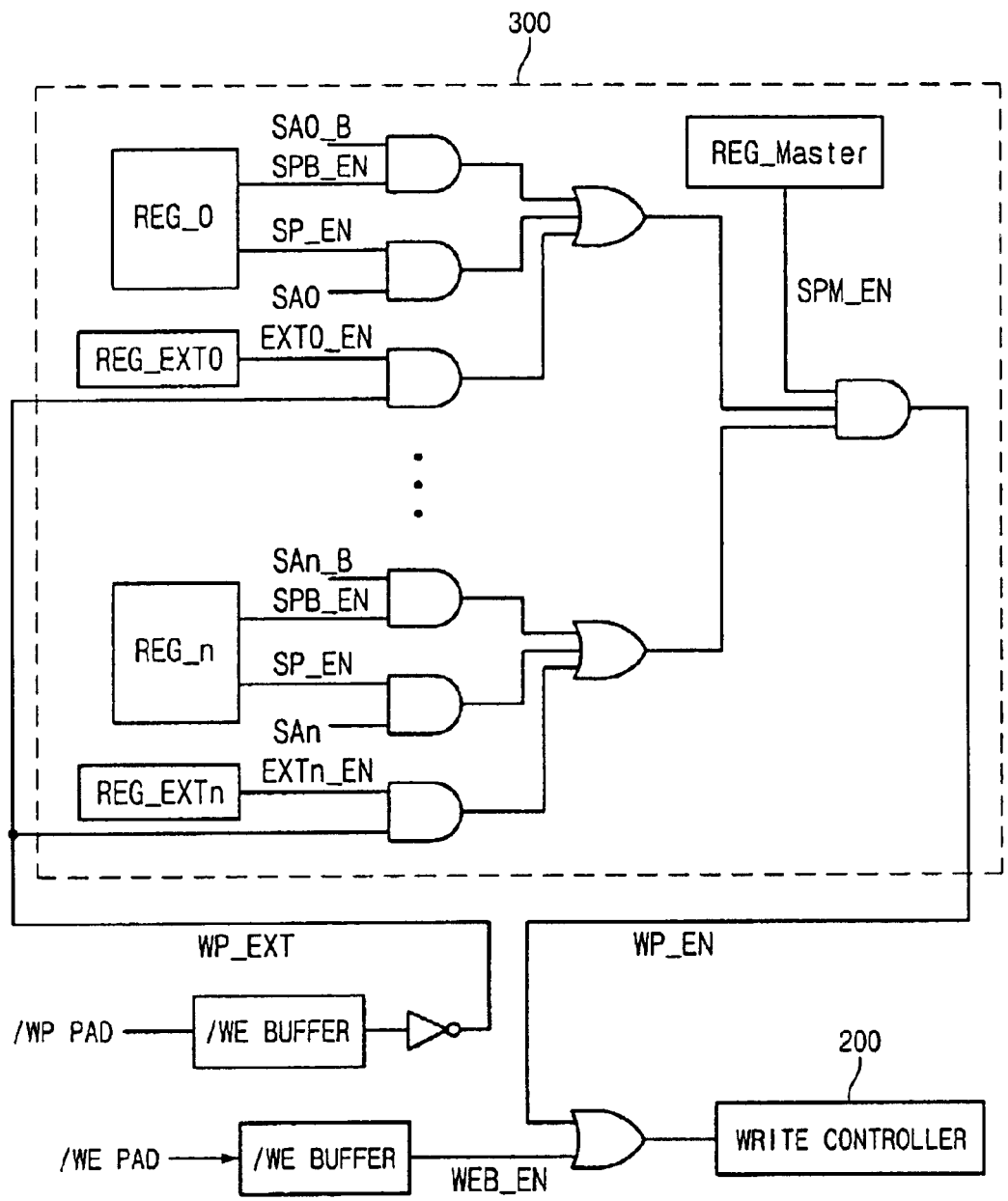

FIG. 17b is a structural diagram showing the write controller 200 of FIG. 1 which includes the write protected /WP buffer, where an output signal of the /WP buffer is provided as the control signal WP_EXT of the write protected region setting unit 300 of FIG. 16b. The other structure is the same as that of FIG. 17a.

Figure 17C:
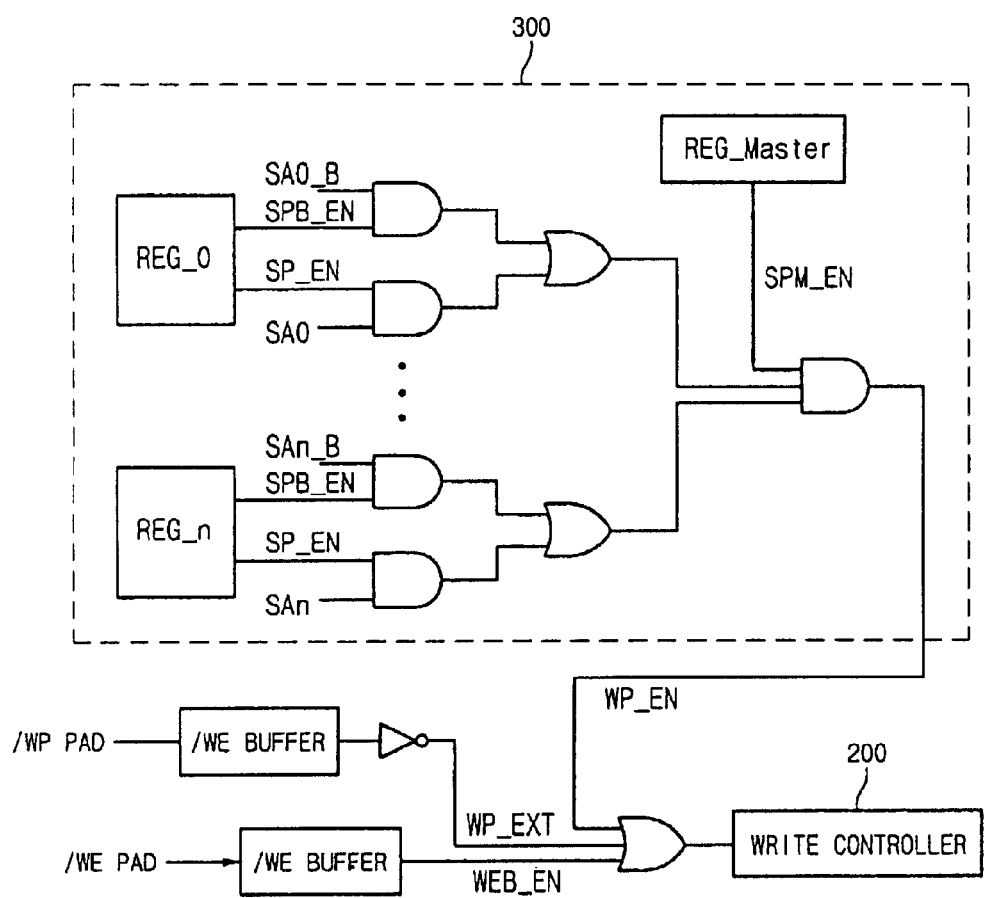

FIG. 17c is a structural diagram showing the write controller 200 of FIG. 1 which includes the write protected /WP buffer as shown in FIG. 17b, where an output signal of the /WP buffer is provided as the control signal WP_EXT, and the write protected region setting unit 300 is the same as that of FIG. 16a. The write controller 200 is controlled by a signal obtained by ORing the control signal WP_EXT, the output signal WP_EN of the write protected region setting unit 300, and the write enable signal WEB_EN. As a result, when the external control signal WP_EXT is activated, the write controller 200 starts a read mode regardless of the output signal WP_EN of the write protected region setting unit 300 and the write enable signal WEB_EN.

As discussed earlier, a nonvolatile memory device of the present invention includes a write protect function which can prevent data loss resulting from an undesired operation in a predetermined memory cell region.

What is claimed is:

1. A nonvolatile memory device including a write protected region, comprising:
    a program command processor for outputting a program command signal by decoding an external signal;
    a write protected region setting unit for storing a region address corresponding to an inputted address when the program command signal is activated, and for outputting a write protect signal when the program command signal is inactivated; and
    a write controller for controlling a write operation not to be performed on a cell corresponding to the region address when the write protect signal is activated.

2. The device according to claim 1, wherein the program command signal is activated if an output enable signal toggles a predetermined number of times when a chip selection signal and a write enable signal are activated.

3. The device according to claim 2, wherein the program command signal is inactivated after the program command signal has been activated for the predetermined number of times.

4. The device according to claim 1, wherein the register comprises:
    a first amplifier for amplifying and fixing a voltage at a node having a higher potential, of a first node and a second node, into a predetermined positive voltage in response to a first control signal;
    a second amplifier for amplifying and fixing a voltage at a node having a lower potential, of the first node and the second node, into a ground voltage in response to a second control signal;
    an input unit for providing a data signal to the first node and the second node in response to a third control signal; and
    a storage unit for storing the signal provided to the first node and the second node in response to a fourth signal, where the stored signal is maintained when a power source is off,
    wherein voltages of the first node and the second node are externally outputted.

5. The device according to claim 4, wherein the first amplifier comprises:
    a first PMOS transistor having a gate to receive the first control signal, and a source connected to a positive power source;
    a second PMOS transistor having a gate connected to the first node, a source connected to a drain of the first PMOS transistor, and a drain connected to the second node; and
    a third PMOS transistor having a gate connected to the second node, a source connected to the drain of the first PMOS transistor, and a drain connected to the first node.

6. The device according to claim 4, wherein the second amplifier comprises:
    a first NMOS transistor having a gate connected to the first node, and a drain connected to the second node;

a second NMOS transistor having a gate connected to the second node, and a drain connected to the first node; and a third NMOS transistor having a gate to receive the second control signal, a drain connected to a source of the first NMOS transistor and a source of the second transistor, and a source connected to a ground.

7. The device according to claim 4, wherein the input unit comprises:

a first NMOS transistor having a gate to receive the third control signal, a source to receive a first data signal, and a drain connected to the first node; and a second NMOS transistor having a gate to receive the third control signal, a source to receive a second data signal, and a drain connected to the second node.

8. The device according to claim 4, wherein the storage unit comprises:

a first ferroelectric capacitor connected between the fourth control signal and the first node;

a second ferroelectric capacitor connected between the fourth control signal and the second node;

a third ferroelectric capacitor connected between the first node and a ground; and a fourth ferroelectric capacitor connected between the second node and a ground.

9. The device according to claim 1, wherein the write protect region setting unit comprises:

a register array for storing the region address; and a comparator for comparing a region address corresponding to the inputted address with an address stored in the register array, and outputting the write protect signal.

10. The device according to claim 9, wherein the write protected region setting unit further comprises a second register array having the same number of the register array, wherein the comparator compares the rest region address bits with the address bits stored in the register array except region address bits corresponding to activated bits stored in the second register array while an external control signal is activated, and outputs the write protect signal.

11. The device according to claim 9, wherein the write protected region setting unit further comprises a master register, and the write protect signal is not activated when a signal stored in the master register is not activated.

12. The device according to claim 10, wherein the write protected region setting unit further comprises a master register, and the write protect signal is not activated when a signal stored in the master register is not activated.

13. The device according to claim 1, wherein the write controller controls a write mode not to be performed on a memory region corresponding to the region address when the write protect signal or the external control signal is activated.

14. A nonvolatile memory device including a write protected region, comprising:

a first register array including a pluarlity of registers where a region address is stored;

a second register array including a plurality of the first register array corresponding to the plurality of registers;

a master register for controlling activation; and a comparator for comparing a region address stored in the first register array with an externally inputted region address except those address bits corresponding to activated registers of the second register array, in response to an output value of the master register, and then outputting a comparison result.

15. A nonvolatile memory device including a write protected region, comprising:

an internal protection signal controller for receiving an externally inputted address and an address of a predetermined protected region, and outputting an internal protection signal;

an external protection signal controller for outputting an external protection signal in response to an external control signal;

a write protect controller for receiving the internal protection signal and the external protection signal, and outputting a write protect signal; and a write controller for controlling read/write operations of the memory device in response to the write protect signal and a write enable signal.

* * * * *